United States Patent
Kuroki (10) Patent No.: US 8,120,978 B2
(45) Date of Patent: Feb. 21, 2012

(54) SEMICONDUCTOR MEMORY DEVICE HAVING AUTO-PRECHARGE FUNCTION

(75) Inventor: Koji Kuroki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 280 days.

(21) Appl. No.: 12/647,277

(22) Filed: Dec. 24, 2009

(65) Prior Publication Data

US 2010/0165769 A1    Jul. 1, 2010

(30) Foreign Application Priority Data

Dec. 25, 2008    (JP) .................................. 2008-329252

(51) Int. Cl.
*G11C 7/00*    (2006.01)
(52) U.S. Cl. ...................... 365/203; 365/233.1; 365/236
(58) Field of Classification Search .................. 365/203, 365/222, 233.1, 233.11, 233.12, 233.14, 365/233.15, 236

See application file for complete search history.

(56) References Cited

U.S. PATENT DOCUMENTS 7,420,873 B2 *   9/2008  Jang ............................ 365/233.1
7,633,831 B2 * 12/2009  Ikeda .......................... 365/233.1
7,826,304 B2 * 11/2010  Jang ............................ 365/233.1

FOREIGN PATENT DOCUMENTS

JP    11-306760    11/1999

* cited by examiner

*Primary Examiner* — Gene Auduong
(74) *Attorney, Agent, or Firm* — McDermott Will & Emery LLP (57) ABSTRACT

To provide a semiconductor memory device including: a first clock generation circuit and a second clock generation circuit that generate a first internal clock and a second internal clock, respectively; a latency counter that counts latency synchronously with the first internal clock; and a recovery counter that counts a write recovery period synchronously with the second internal clock. The second clock generation circuit activates the second internal clock when auto-precharge is designated, and deactivates the second internal clock when the auto-precharge is not designated. With this configuration, the recovery counter does not perform any counting operation when an auto-precharge function is not operated, and thus unnecessary power consumption can be prevented.

16 Claims, 9 Drawing Sheets

|  | CLOCK GENERATION CIRCUIT 70 (ICLKW) | CLOCK GENERATION CIRCUIT 80 (ICLKWA) |
|---|---|---|
| AUTO-PRECHARGE IS NOT DESIGNATED (PA10=L) | OPERATIVE | STOP |
| AUTO-PRECHARGE IS DESIGNATED (PA10=H) | OPERATIVE | OPERATIVE |

SEMICONDUCTOR MEMORY DEVICE HAVING AUTO-PRECHARGE FUNCTION

BACKGROUND OF THE INVENTION

1. Field of the Invention

The present invention relates to a semiconductor memory device, and more particularly relates to a semiconductor memory device including an auto-precharge function for automatically resetting a word line and of precharging a bit line after ending a read operation or a write operation.

2. Description of Related Art

An operation performed by a synchronous DRAM (Dynamic Random Access Memory), which is a representative semiconductor memory device, is controlled based on a command and an address issued synchronously with an external clock signal. Specifically, when a row address is supplied to a synchronous DRAM synchronously with an active command and then a column address is supplied thereto synchronously with a read command, read data is output from the DRAM after passage of CAS latency since an input of the read command. Furthermore, when a row address is supplied to the DRAM synchronously with an active command and then a column address is supplied thereto synchronously with a write command, write data can be input to the DRAM after passage of CAS write latency since an input of the write command.

After performing such a read operation or a write operation, the DRAM issues a precharge command, thereby resetting a word line and precharging a bit line.

In recent years, synchronous DRAMs often include "auto-precharge function" for automatically resetting word lines and of precharging bit lines after performing a read operation or a write operation (see Japanese Patent Application Laid-open No. H11-306760). A DRAM of this type can designate whether to perform auto-precharge at the time a read command or a write command being issued by using a predetermined address pin. Accordingly, there is no need to input a precharge command to the DRAM after ending the operation, and it suffices to only designate the auto-precharge at the time of issuing the read command or the write command.

Meanwhile, some users wish to input a precharge command without using any auto-precharge function. In such a case, it is not required to designate auto-precharge at the time of issuing a read command or a write command.

When a DRAM is to perform auto-precharge using an auto-precharge function, it is necessary to execute precharge after data is correctly written (or re-written during a read operation) to each memory cell, that is, after passage of a sufficient write recovery period. Due to this necessity, it is required for the DRAM to include a counter circuit that measures the write recovery period so as to realize the auto-precharge function.

However, conventional synchronous DRAMs have the following problems. Because clocks used for recent synchronous DRAMs have quite high frequency, it is necessary to provide multistage flip-flop circuits in the counter circuit used to count the write recovery period. Even if the auto-precharge function is not operated, the counter circuit performs a counting operation whenever a read operation or a write operation is performed. As a result, the DRAM consumes large power when the auto-precharge function is not operated.

There has been strong demand for lower power consumption in synchronous DRAMs and it has been desired to reduce the unnecessary power consumption as described above.

SUMMARY

The present invention seeks to solve one or more of the above problems, or to improve upon those problems at least in part.

In one embodiment, there is provided a semiconductor memory device having an auto-precharge function of automatically resetting a word line and of precharging a bit line after ending a read operation or a write operation, the semiconductor memory device comprising: first and second clock generation circuits that generate first and second internal clocks, respectively; a first counter circuit that counts at least latency indicating number of clocks since issuance of a read command until an output of read data or number of clocks since issuance of a write command until an input of write data, synchronously with the first internal clock; and a second counter circuit that counts at least a write recovery period since completion of an output of the read data or completion of an input of the write data until start of auto-precharge, synchronously with the second internal clock, wherein the second clock generation circuit activates the second internal clock when the auto-precharge is designated at time of issuance of the read command or the write command, and deactivates the second internal clock when the auto-precharge is not designated at the time of issuance of the read command or the write command.

According to the present invention, the second internal clock used for counting a write recovery period is generated separately from the first internal clock used for counting latency. When auto-precharge is not designated, the second internal clock is deactivated (stopped). Accordingly, when the auto-precharge function is not used, the second counter does not perform any counting operation. Therefore, it is possible to prevent unnecessary power consumption.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
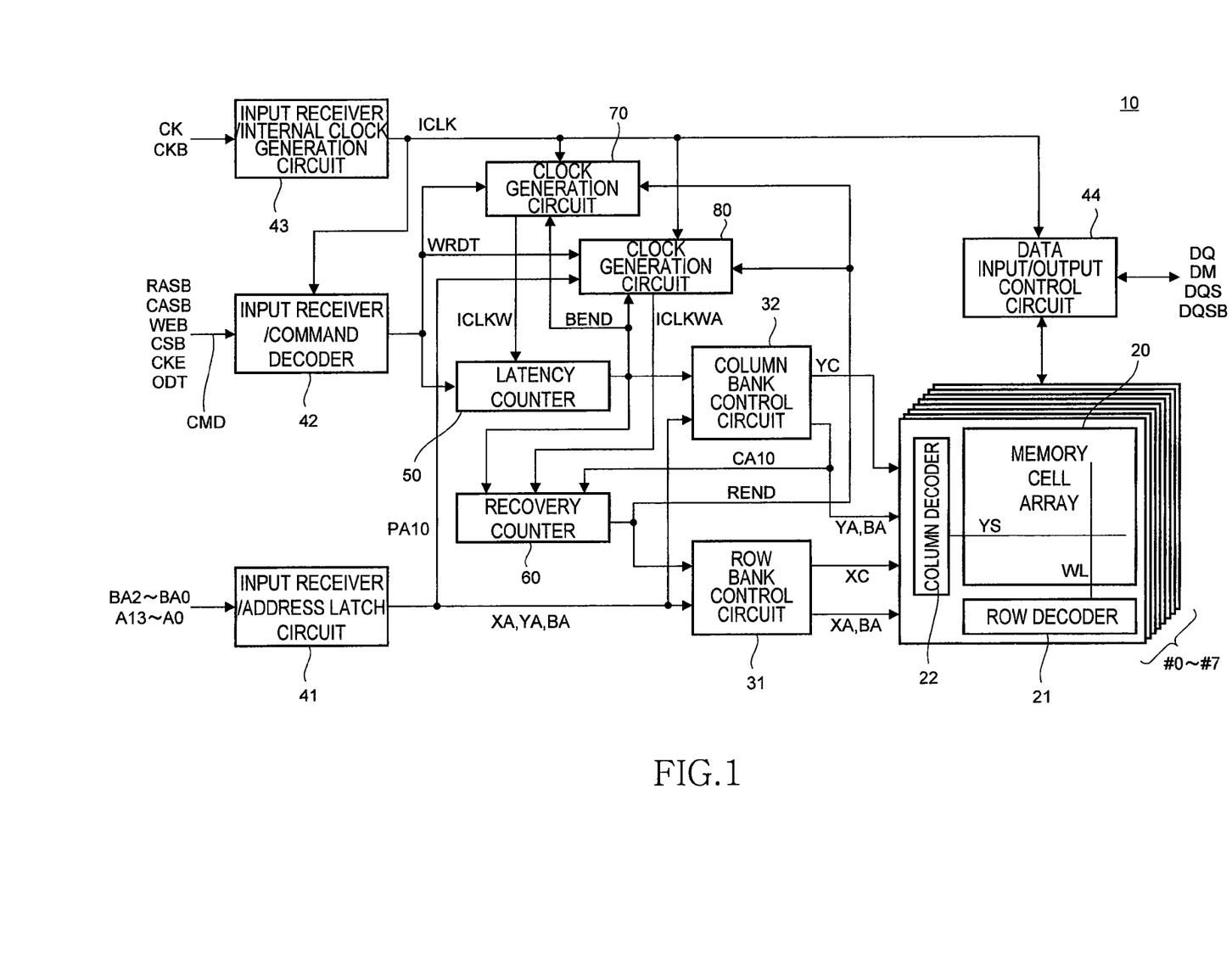
FIG. 1 is a block diagram showing a configuration of a semiconductor memory device 10 according to a first embodiment of the present invention.

FIG. 1 is a block diagram showing a configuration of a semiconductor memory device 10 according to a first embodiment of the present invention.

As shown in FIG. 1, the semiconductor memory device 10 according to the first embodiment includes a memory cell array 20 that includes banks #0 to #7, a row decoder 21 that selects a row of the memory cell array 20, and a column decoder 22 that selects a column of the memory cell array 20.

A row address XA, a bank address BA, and a row control signal XC are supplied to the row decoder 21 from a row bank control circuit 31. Based on the addresses and signal, the row decoder 21 selects a word line WL included in the memory cell array 20. A column address YA, a bank address BA, and a column control signal YC are supplied to the column decoder from a column bank control circuit 32. Based on the addresses and signal, the column decoder 22 selects a column selection line YS. The column selection line YS is a signal for selecting a bit line BL included in the memory cell array 20.

The row address XA and the bank address BA are supplied to the row bank control circuit 31 from an input receiver/address latch circuit 41, and a recovery end signal REND is supplied thereto from a recovery counter 60. In the first embodiment, the row address XA is configured, although not limited to, to include 14 bits of X13 to X0, and the 14 bits are input via address pins A13 to A0, respectively. The bank address BA is configured to include three bits of B2 to B0, and the three bits are input via address pins BA2 to BA0, respectively. The three-bit bank address BA is used to select one of the eight banks #0 to #7.

The column address YA and the bank address BA are supplied to the column control circuit 32 from the input receiver/address latch circuit 41, and a burst end signal BEND is supplied thereto from a latency counter 50. In the first embodiment, although not limited to, the column address YA is configured to include ten bits of Y9 to Y0, and the ten bits are input via address pins A9 to A0, respectively. Therefore, the address pins A13 to A10 are not used at the time of inputting the column address YA.

With this configuration, the address pin A10 is used to designate an auto-precharge function at the time of inputting a column address. Specifically, when the address pin A10 is set to a high level when a column address is input, auto-precharge is designated to automatically reset a word line and to precharge a bit line after ending a read operation or a write operation. On the other hand, when the address pin A10 is set to a low level when the column address is input, auto-precharge is not designated. In this case, it is necessary to input a precharge command after ending a read operation or a write operation.

As shown in FIG. 1, a signal PA10 (an auto-precharge designation signal) input via the address pin A10 at the time of inputting a column address is supplied to a clock generation circuit 80. The clock generation circuit 80 is a circuit that supplies an internal clock ICLKWA to the recovery counter 60. On the other hand, a clock generation circuit 70 is a circuit that supplies an internal clock ICLKW to the latency counter 50. In this way, the different clock generation circuits 70 and 80 supply different internal clocks (that is, the internal clocks ICLKW and ICLKWA) to the latency counter 50 and the recovery counter 60, respectively. Configurations of the clock generation circuits 70 and 80 are described later.

The latency counter 50 is a counter circuit (a first counter circuit) that counts CAS latency, CAS write latency, and a burst length. The latency counter 50 performs the counting operation synchronously with the internal clock ICLKW (a first internal clock) supplied from the clock generation circuit 70. The "CAS latency" is the number of clocks since issuance of a read command until start of an output of read data. The "CAS write latency" is the number of clocks since issuance of a write command until start of an input of write data. Further, the "burst length" is the number of clocks necessary for burst output or burst input.

During a read operation, when counting of the CAS latency and the burst length is finished, the latency counter 50 outputs the burst end signal BEND. During a write operation, when counting of the CAS write latency and the burst length is finished, the latency counter 50 outputs the burst end signal BEND. The burst end signal BEND is supplied to the column bank control circuit 32, the recovery counter 60, and the clock generation circuits 70 and 80.

An internal command supplied to the latency counter 50 is supplied from an input receiver/command decoder 42.

The input receiver/command decoder 42 receives commands (RASE, CASB, WEB, CSB, CKE, and ODT) supplied from outside, and decodes these received commands, thereby generating various internal commands. Although the input receiver/command decoder 42 generates various internal commands, FIG. 1 only shows an internal write command WRDT. The internal write command WRDT is an internal command activated when a write command is issued from outside. The internal write command WRDT is supplied to the latency counter 50 and the clock generation circuits 70 and 80.

The recovery counter 60 is a circuit (a second counter circuit) that counts a write recovery period (tWR) since completion of a read operation or a write operation until data is correctly written (or rewritten during the read operation) to a memory cell. The recovery counter 60 performs the counting operation synchronously with the internal clock ICLKWA (a second internal clock) supplied from the clock generation circuit 80. The burst end signal BEND and an auto-precharge designation signal CA10 as well as the internal clock ICLKWA are supplied to the recovery counter 60. The auto-precharge signal CA10 is a signal corresponding to the auto-precharge designation signal PA10 and output from the column bank control circuit 32 synchronously with ending of a burst operation. Upon counting the write recovery period, the recovery counter 60 activates the recovery end signal REND. The recovery end signal REND is supplied to the row bank control circuit 31 and the clock generation circuits 70 and 80.

The semiconductor memory device 10 also includes an input receiver/internal clock generation circuit 43. The input receiver/internal clock generation circuit 43 is a circuit that receives external clocks CK and CKB supplied from outside and that generates an internal clock ICLK based on the received external clocks CK and CKB. The internal clock ICLK is supplied to not only the clock generation circuits 70 and 80 but also various internal circuits such as the input receiver/command decoder 42 and a data input/output control circuit 44. Operation timings of these internal circuits are controlled based on the internal clock ICLK. The data input/output control circuit 44 is a circuit connected to terminals (DQ, DM, DQS, and DQSB) related to data input and output, and controls the data input and output.

Figure 2:
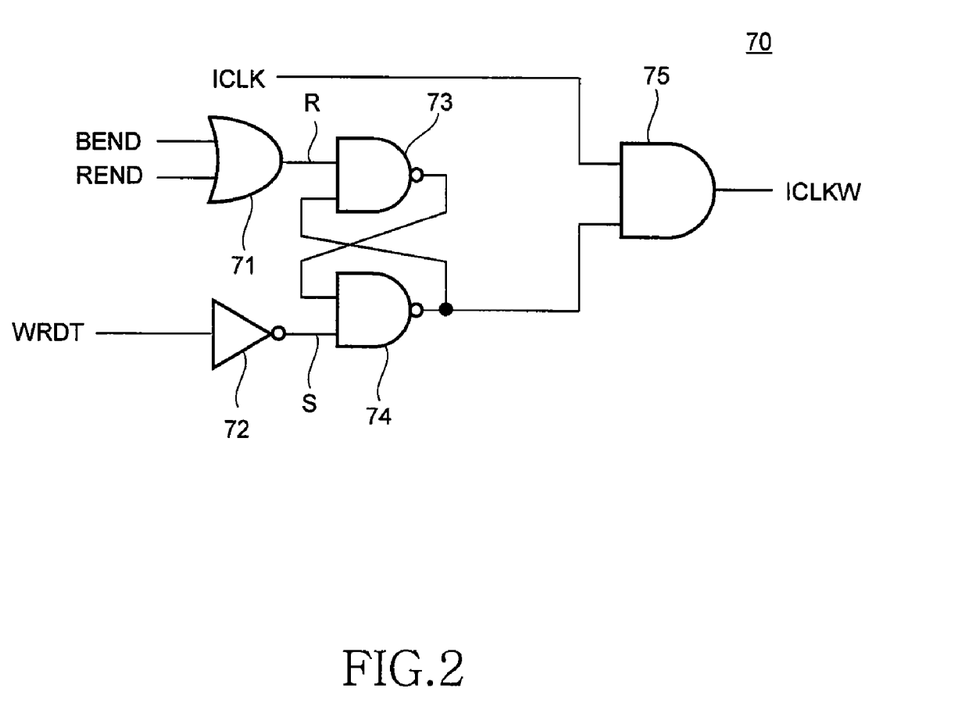
FIG. 2 is a circuit diagram of the clock generation circuit 70.

FIG. 2 is a circuit diagram of the clock generation circuit 70.

As shown in FIG. 2, the clock generation circuit 70 is configured to include an OR circuit 71, an inverter 72, an SR latch that includes NAND circuits 73 and 74, and an AND circuit 75. The OR circuit 71 receives the burst end signal BEND and the recovery end signal REND, and supplies an OR output to a reset terminal R of the SR latch. An inverted signal of the internal write command WRDT is supplied to a set terminal S of the SR latch via the inverter 72.

With the configuration of the clock generation circuit 70, when the internal write command WRDT is activated to a high level, the SR latch is set and the internal clock ICLKW (the first internal clock) output from the clock generation circuit 70 is made identical in waveform to the internal clock ICLK. When both the burst end signal BEND and the recovery end signal REND are turned to a low level, the SR latch is reset and clocking of the internal clock ICLKW is stopped. That is, the internal clock ICLKW is kept inactive.

Figure 3:
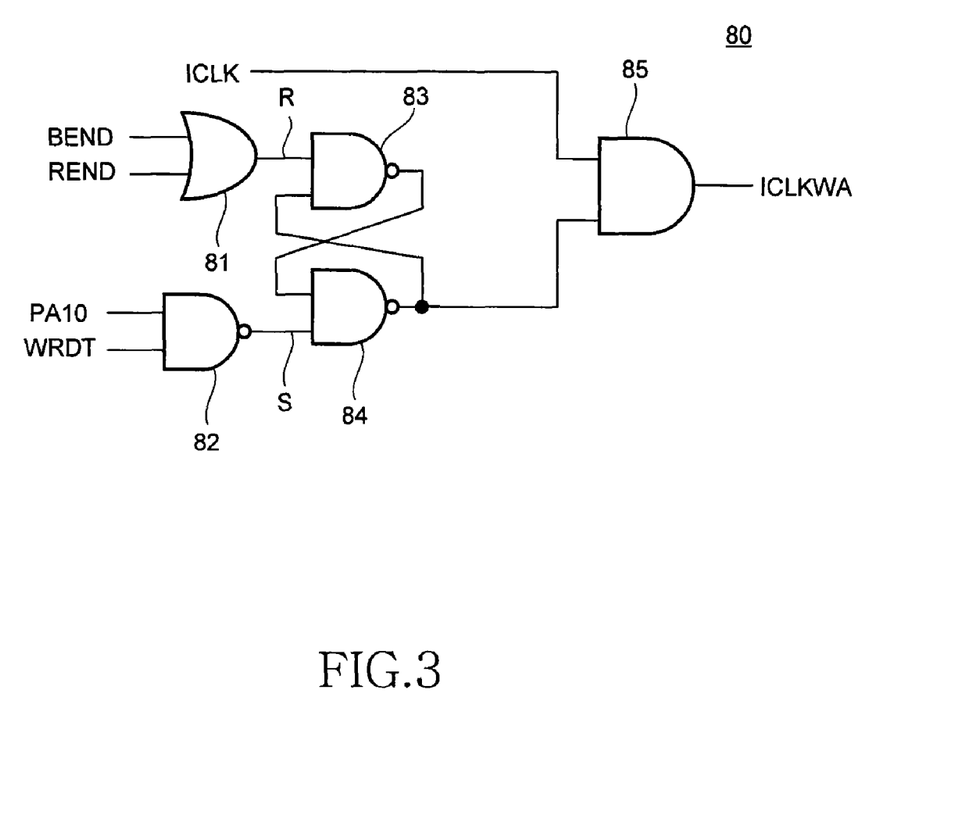
FIG. 3 is a circuit diagram of the clock generation circuit 80.

FIG. 3 is a circuit diagram of the clock generation circuit 80.

As shown in FIG. 3, the clock generation circuit 80 is configured to include an OR circuit 81, NAND circuits 82 to 84, and an AND circuit 85. The OR circuit 81 receives the burst end signal BEND and the recovery end signal REND, and supplies an OR output to the reset terminal R of an SR latch configured to include the NAND circuits 83 and 84. The NAND circuit 82 receives the internal write command WRDT and the auto-precharge designation signal PA10, and supplies a NAND output to the set terminal S of the SR latch including the NAND circuits 83 and 84.

With the configuration of the clock generation circuit 80, when both the internal write command WRDT and the auto-precharge designation signal PA10 are activated to a high level, the SR latch is set and the internal clock ICLKWA (the second internal clock) output from the clock generation circuit 80 is made identical in waveform to the internal clock ICLK. When both the burst end signal BEND and the recovery end signal REND are turned to a low level, the SR latch is reset and clocking of the internal clock ICLKWA is stopped. That is, the internal clock ICLKWA is kept inactive.

In this way, in the clock generation circuit 80, the auto-precharge designation signal PA10 is supplied to the NAND circuit 82. Accordingly, when the auto-precharge designation signal PA10 is a high level, that is, the auto-precharge is designated, the clock generation circuit 80 performs an operation identical to that of the clock generation circuit 70 shown in FIG. 2. On the other hand, when the auto-precharge designation signal PA10 is a low level, that is, the auto-precharge is not designated, the SR latch including the NAND circuits 83 and 84 is not set. Therefore, the internal clock ICLKWA is kept inactive.

Figure 4:
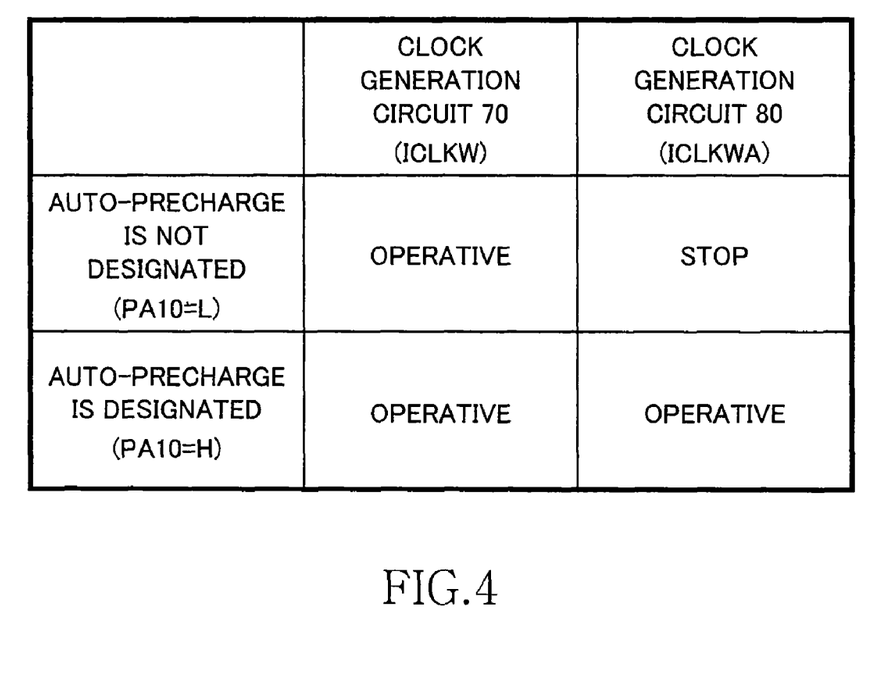
FIG. 4 is a table showing a relationship among operations performed by the clock generation circuits 70 and 80 and the auto-precharge designation signal PA10.

FIG. 4 is a table showing a relationship among operations performed by the clock generation circuits 70 and 80 and the auto-precharge designation signal PA10.

As shown in FIG. 4, the clock generation circuit 70 is always operative during the write operation irrespectively of the level of the auto-precharge designation signal PA10. That is, the clock generation circuit 70 generates the internal clock ICLKW. On the other hand, the clock generation circuit 80 generates the internal clock ICLKWA only when the auto-precharge designation signal PA10 is a high level, that is, the auto-precharge is designated, and stops operating when the auto-precharge is not designated.

Figure 5:
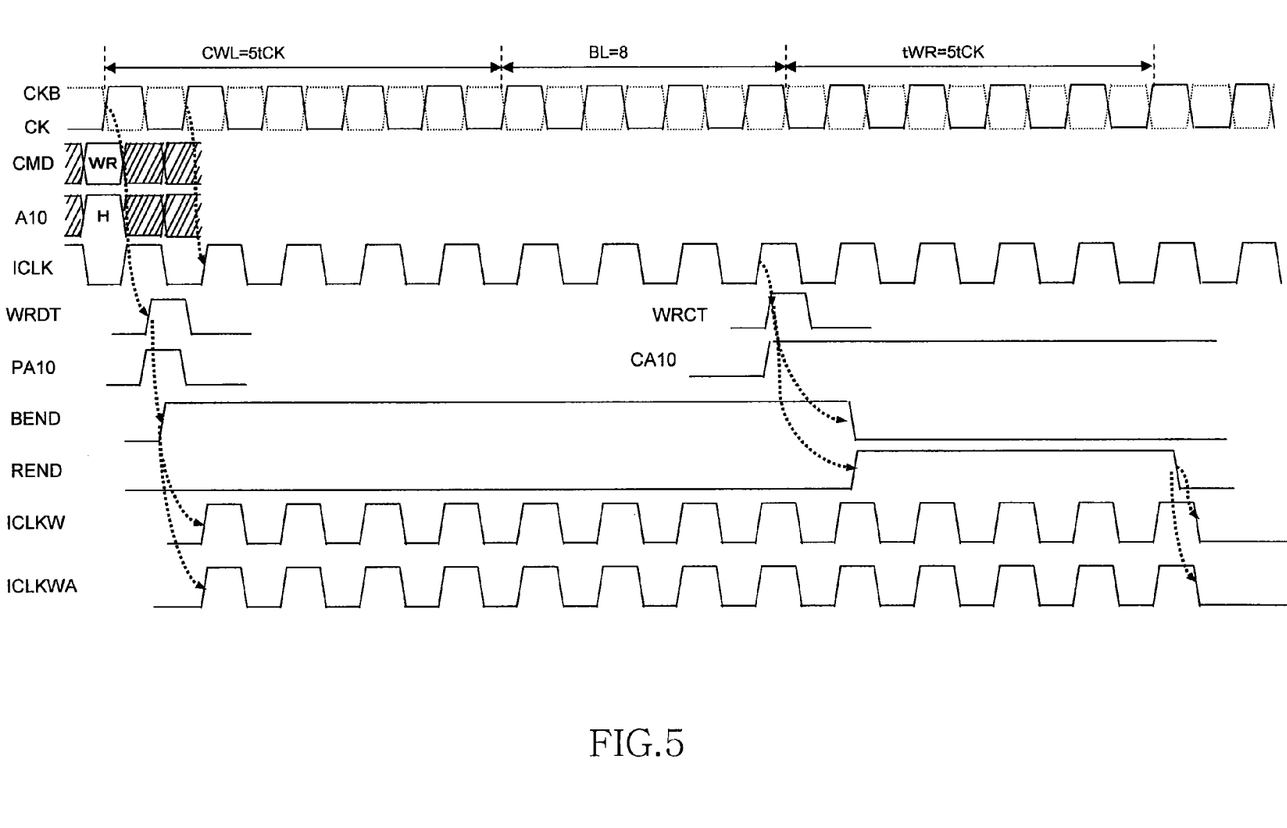
FIG. 5 is a timing diagram showing a write operation when the auto-precharge is designated.

FIG. 5 is a timing diagram showing a write operation when the auto-precharge is designated. The auto-precharge is designated during the write operation by setting the address pin A10 to a high level when a write command (WR) is input.

First, when the write command (WR) is input, the input receiver/command decoder 42 decodes the write command (WR) and sets the internal write command WRDT to a high level by as much as one clock cycle. With this arrangement, the SR latch including the NAND circuits 73 and 74 shown in FIG. 2 is set, and the clock generation circuit 70 generates the internal clock ICLKW synchronously with the internal clock ICLK.

The input receiver/address latch circuit 41 having received auto-precharge designation via the address pin A10 sets the auto-precharge designation signal PA10 to a high level. With this arrangement, the SR latch including the NAND circuits 83 and 84 is set, and the clock generation circuit 80 generates the internal clock ICLKWA synchronously with the internal clock ICLK.

Furthermore, the internal write command WRDT is also supplied to the latency counter 50. In response to the internal write command WRDT, the latency counter 50 sets the burst end signal BEND to a high level. With this arrangement, the SR latches included in the respective clock generation circuits 70 and 80 are kept set.

When the latency counter 50 finishes counting of predetermined CAS write latency and burst length, the burst end signal BEND changes to a low level. Note that the CAS write latency is latency indicating the number of clocks since issuance of a write command until start of an input of write data. In the example shown in FIG. 5, the CAS write latency is five clock cycles (CWL=5 tCK). The burst length indicates the number of clocks since start of an input of write data until completion of the input of the write data. In the example shown in FIG. 5, the burst length is four bits (BL=8).

In the example shown in FIG. 5, auto-precharge is designated, and therefore, in response to transition of the auto-precharge designation signal CA10 to a high level, the recovery counter 60 changes the recovery end signal REND to a high level. Due to this change, the SR latches included in the respective clock generation circuits 70 and 80 are not reset and clocking of the internal clocks ICLKW and ICLKWA continues. Therefore, even after ending the burst write, the latency counter 50 and the recovery counter 60 can operate continuously and correctly.

When the recovery counter 60 finishes counting of the write recovery period, the recovery end signal REND changes to a low level. As a result, the SR latches included in the respective clock generation circuits 70 and 80 are reset and the internal clocks ICLKW and ICLKWA are stopped. In the example shown in FIG. 5, the write recovery period is five clock cycles (tWR=5 tCK).

In this way, when the auto-precharge is designated, the clocking of the internal clocks ICLKW and ICLKWA continues even after ending the burst write, thereby making it possible to correctly execute the auto-precharge.

Figure 6:
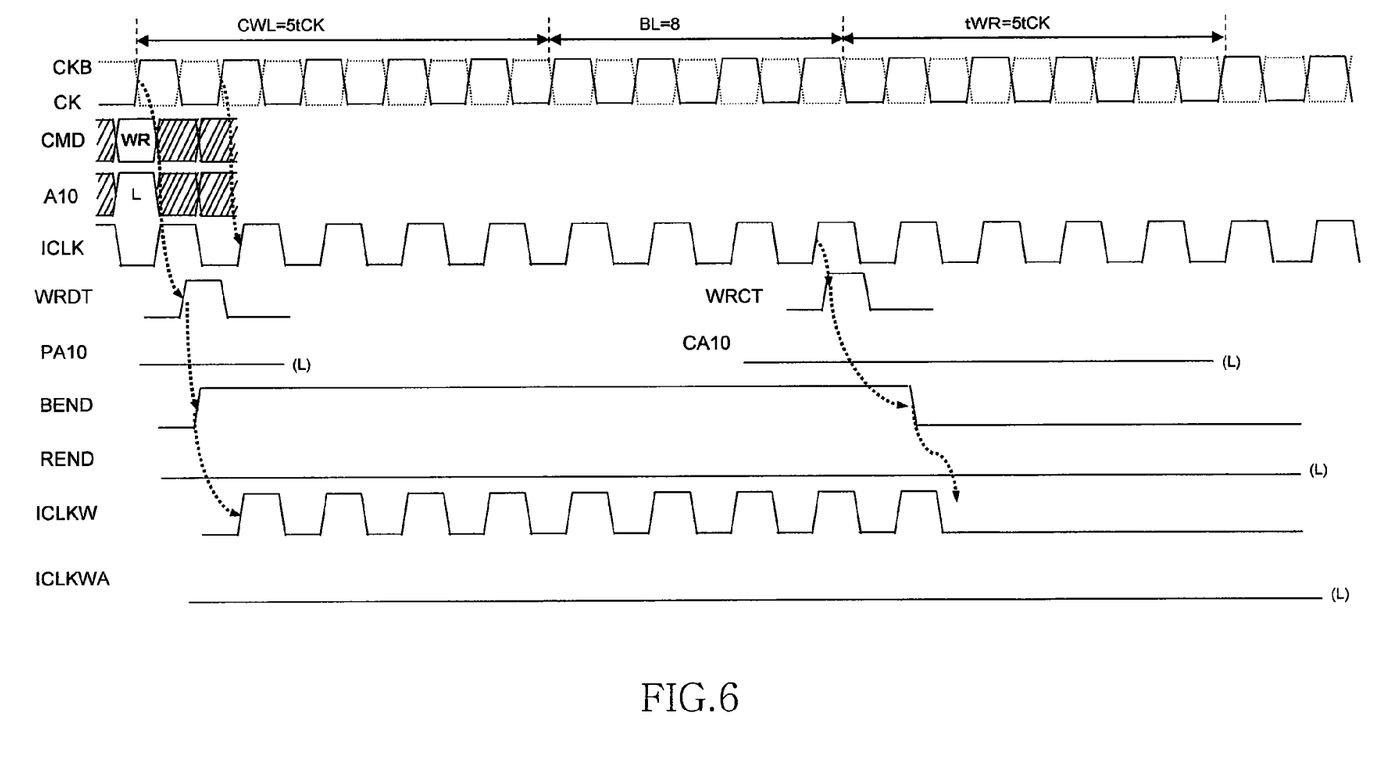
FIG. 6 is a timing diagram showing a write operation when auto-precharge is not designated.

FIG. 6 is a timing diagram showing a write operation when auto-precharge is not designated. Non-designation of the auto-precharge during the write operation is made by setting the address pin A10 to a low level when the write command (WR) is input.

As described above, the operation performed by the clock generation circuit 70 when the auto-precharge is not designated is the same as that when the auto-precharge is designated as shown in FIG. 5. Therefore, as shown in FIG. 6, the clock generation circuit 70 starts clocking the internal clock ICLKW in response to generation of the internal write command WRDT. This operation is as described with reference to FIG. 5.

Meanwhile, in this example, since the auto-precharge designation signal PA10 is a low level, the SR latch including the NAND circuits 83 and 84 shown in FIG. 3 is not set. Therefore, the internal clock ICLKWA output from the clock generation circuit 80 is kept inactive.

When the latency counter 50 finishes counting of the predetermined CAS write latency and burst length, the burst end signal BEND changes to a low level.

In the example shown in FIG. 6, the auto-precharge is not designated, and thus the auto-precharge designation signal CA10 is kept as a low level. Accordingly, the recovery end signal REND output from the recovery counter 60 is kept as a low level. Therefore, in response to transition of the burst end signal to a low level, the SR latch included in the clock generation circuit 70 is reset and the internal clock ICLKW is stopped.

As can be understood, when the auto-precharge is not designated, the clock generation circuit 80 does not generate the internal clock ICLKWA. Further, the clock generation circuit 70 stops clocking the internal clock ICLKW in response to ending the burst write.

As described above, when the auto-precharge is not designated in the semiconductor memory device 10 according to the first embodiment, the internal clock ICLKWA is stopped and the recovery counter 60 does not perform any counting operation. Therefore, the semiconductor memory device 10 can suppress unnecessary power when consumption the auto-precharge is not designated.

A second embodiment of the present invention is explained next.

Figure 7:
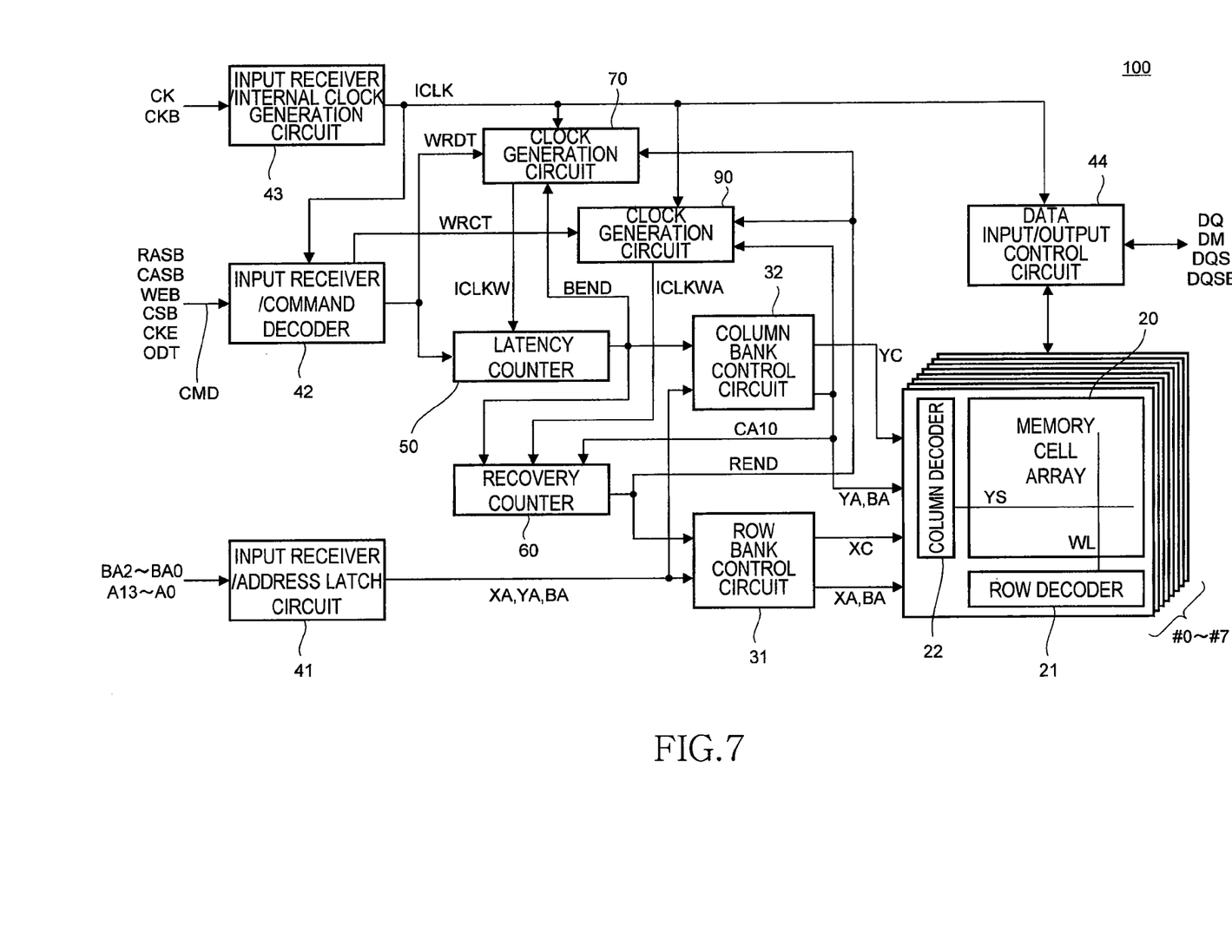
FIG. 7 is a block diagram showing a semiconductor memory device 100 according to a second embodiment.

FIG. 7 is a block diagram showing a semiconductor memory device 100 according to the second embodiment.

The semiconductor memory device 100 according to the second embodiment differs from the semiconductor memory device 10 shown in FIG. 1 in that the clock generation circuit 80 that generates the internal clock ICLKWA is replaced by a clock generation circuit 90. An internal clock ICLK, a recovery end signal REND, an auto-precharge designation signal CA10, and an internal write command WRCT are supplied to the clock generation circuit 90. Differently from the clock generation circuit 80 according to the first embodiment, the burst end signal BEND, an auto-precharge designation signal PA10, and the internal write command WRDT are not input to the clock generation circuit 90.

Figure 8:
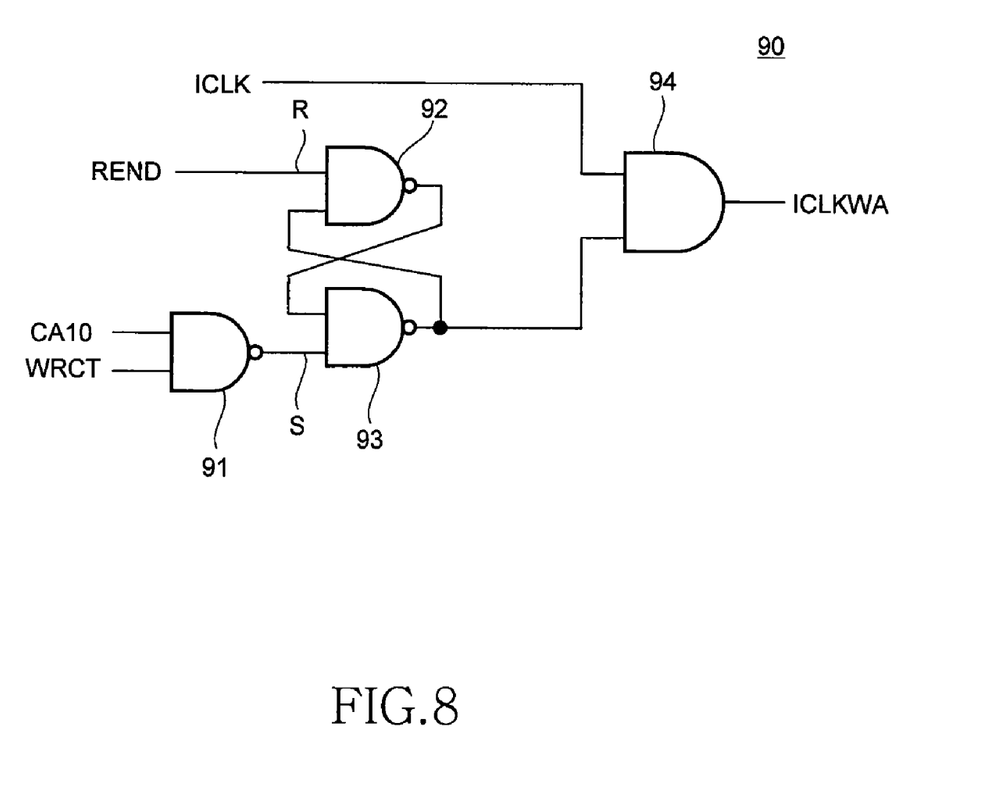
FIG. 8 is a circuit diagram of the clock generation circuit 90.

FIG. 8 is a circuit diagram of the clock generation circuit 90.

As shown in FIG. 8, the clock generation circuit 90 is configured to include NAND circuits 91 to 93 and an AND circuit 94. Upon receiving an internal write command WRCT and the auto-precharge designation signal CA10, the NAND circuit 91 supplies a NAND output to the set terminal S of an SR latch including the NAND circuits 92 and 93. With this configuration, when both the internal write command WRCT and the auto-precharge designation signal CA10 are activated to a high level, the SR latch is set and the internal clock ICLKWA (the second internal clock) output from the clock generation circuit 90 is made identical in waveform to an internal clock ICLK. Note that the internal write command WRCT is an internal command output synchronously with ending of a burst operation after issuance of the write command (WR). When the recovery end signal REND input to the reset terminal R of the SR latch is set to a low level, the SR latch is reset and the internal clock ICLKWA is stopped. That is, the internal clock ICLKWA is kept inactive.

Figure 9:
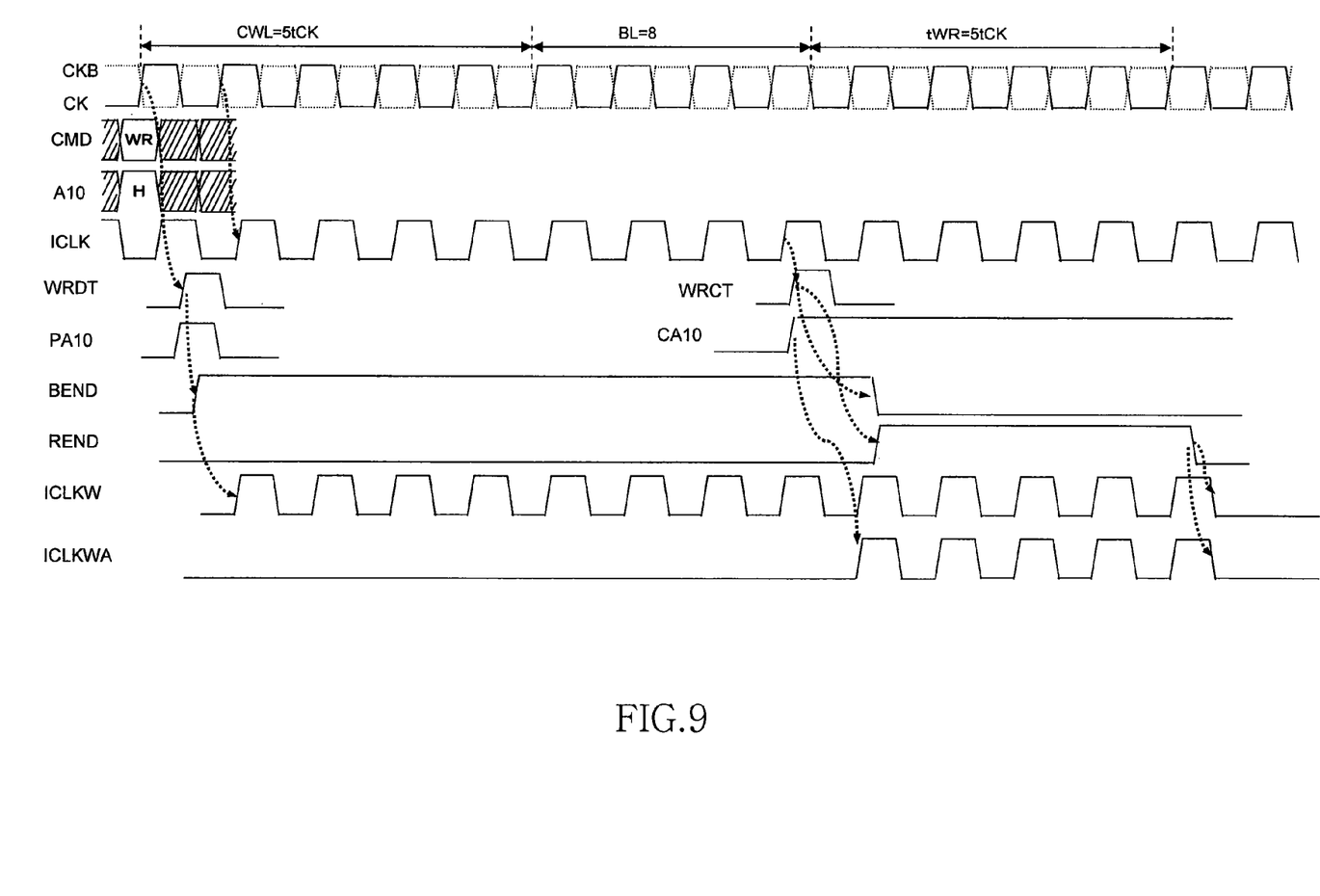
FIG. 9 a timing diagram showing a write operation when auto-precharge is designated in the second embodiment.

FIG. 9 is a timing diagram showing a write operation when auto-precharge is designated.

A clock generation circuit 70 operates similarly to the first embodiment. Accordingly, as shown in FIG. 9, the clock generation circuit 70 starts clocking the internal clock ICLKW in response to generation of the internal write command WRDT. This operation is as described with reference to FIG. 5.

Meanwhile, at the time an SR latch included in the clock generation circuit 70 is set, the SR latch included in the clock generation circuit 90 is not set yet. Accordingly, the internal clock ICLKWA is kept inactive.

Thereafter, when the internal write command WRCT and the auto-precharge designation signal CA10 are both set to a high level synchronously with ending of the burst operation, the SR latch including the NAND circuits 92 and 93 shown in FIG. 8 is set and the clock generation circuit 90 generates the internal clock ICLKWA synchronously with the internal clock ICLK.

Furthermore, the recovery counter 60 changes the recovery end signal REND to a high level in response to transition of the auto-precharge designation signal CA10 to a high level. With this arrangement, the SR latches included in the respective clock generation circuits 70 and 90 are kept set.

When the recovery counter 60 finishes counting of a write recovery period, the recovery end signal REND changes to a low level. As a result, the SR latches included in the respective clock generation circuits 70 and 90 are reset and the internal clocks ICLKW and ICLKWA are stopped.

In the second embodiment, operations when auto-precharge is not designated are the same as those of the first embodiment, and thus redundant explanations thereof will be omitted.

As described above, when the auto-precharge is designated in the semiconductor memory device 100 according to the second embodiment, the clock generation circuit 90 does not generate the internal clock ICLKWA during a period since issuance of the write command until completion of an input of write data (completion of the burst operation), but activates the internal clock ICLKWA only during the recovery period. Accordingly, similarly to the clock generation circuit 90, the recovery counter 60 does not perform the counting operation during the period since issuance of the write command until completion of an input of the write data (completion of the burst operation). Therefore, it is possible to suppress unnecessary power consumption even when the auto-precharge is designated.

It is apparent that the present invention is not limited to the above embodiments, but may be modified and changed without departing from the scope and spirit of the invention.

In the embodiments described above, a case that a semiconductor memory device performs a write operation has been described by way of example. The same is true for a case that the semiconductor memory device performs a read operation. In this case, when auto-precharge is designated at the time of issuance of a read command, a word line is reset and a bit line is precharged after passage of a write recovery period after ending of the read operation. It suffices that the latency counter 50 further counts latency (CAS latency) indicating the number of clocks since issuance of a read command until start of an output of read data and a burst length indicating the number of clocks since start of an output of read data until completion of the output of the read data. Furthermore, it suffices that the recovery counter 60 counts a write recovery period since completion of an output of the read data until start of auto-precharge synchronously with the internal clock ICLKWA.

In the above embodiments, a case that the semiconductor memory device performs a burst operation has been explained by way of example. However, the semiconductor memory device according to the present invention does not essentially perform the burst operation. Accordingly, as long as the semiconductor memory device does not perform any burst operation, it suffices that the latency counter 50 counts CAS latency or CAS write latency without need to count the burst length.

Further, while the address pin A10 is used for auto-precharge designation in the above embodiments, the method of auto-precharge designation is not limited thereto.

What is claimed is:

1. A semiconductor memory device having an auto-precharge function of automatically resetting a word line and of precharging a bit line after ending a read operation or a write operation, the semiconductor memory device comprising:
   first and second clock generation circuits that generate first and second internal clocks, respectively;
   a first counter circuit that counts at least latency indicating number of clocks since issuance of a read command until an output of read data or number of clocks since issuance of a write command until an input of write data, synchronously with the first internal clock; and
   a second counter circuit that counts at least a write recovery period since completion of an output of the read data or completion of an input of the write data until start of auto-precharge, synchronously with the second internal clock, wherein
   the second clock generation circuit activates the second internal clock when the auto-precharge is designated at time of issuance of the read command or the write command, and deactivates the second internal clock when the auto-precharge is not designated at the time of issuance of the read command or the write command.

2. The semiconductor memory device as claimed in claim 1, wherein the second counter circuit counts a period since issuance of the read command or the write command until start of the auto-precharge.

3. The semiconductor memory device as claimed in claim 1, wherein the second counter circuit counts the write recovery period without counting a period since issuance of the read command or the write command until completion of an output of the read data or completion of an input of the write data.

4. The semiconductor memory device as claimed in claim 1, wherein the first counter circuit further counts a burst length indicating number of clocks since start of an output of the read data until completion of an output of the read data or indicating number of clocks since start of an input of the write data until completion of an input of the write data.

5. The semiconductor memory device as claimed in claim 2, wherein the first counter circuit further counts a burst length indicating number of clocks since start of an output of the read data until completion of an output of the read data or indicating number of clocks since start of an input of the write data until completion of an input of the write data.

6. The semiconductor memory device as claimed in claim 3, wherein the first counter circuit further counts a burst length indicating number of clocks since start of an output of the read data until completion of an output of the read data or indicating number of clocks since start of an input of the write data until completion of an input of the write data.

7. A semiconductor memory device comprising:
   a plurality of command pins that supplied with an external command including first and second commands that are issued in this order;
   a plurality of address pins that supplied with an external address signal including first and second address signals that are supplied in this order, the first address signal being supplied to a first set of address pins including a predetermined address pin, the second address being supplied to a second set of address pins excluding the predetermined address pin;
   a memory cell array having a plurality of word lines and a plurality of bit lines;
   a row decoder that selects any of the word lines based on the first address signal that is supplied synchronously with the first command;
   a column decoder that selects any of the bit lines based on the second address signal that is supplied synchronously with the second command;
   a clock generation circuit that activates an internal clock when the predetermined address pin is supplied with a first logic level synchronously with the second command and deactivates the internal clock when the predetermined address pin is supplied with a second logic level synchronously with the second command; and
   a recovery counter circuit that resets the word lines and starts a precharge of the bit lines by counting an internal clock signal.

8. The semiconductor memory device as claimed in claim 7, wherein the clock generation circuit starts activation of the internal clock synchronously with the second command.

9. The semiconductor memory device as claimed in claim 8, wherein the clock generation circuit starts activation of the internal clock before an output of a read data or an input of a write date is not completed.

10. The semiconductor memory device as claimed in claim 7, wherein the clock generation circuit starts activation of the internal clock after passage of a predetermined period since the second command is issued.

11. The semiconductor memory device as claimed in claim 10, wherein the predetermined period includes a CAS latency or a CAS write latency.

12. The semiconductor memory device as claimed in claim 11, wherein the predetermined period further includes a burst length.

13. A semiconductor device comprising:
   a memory cell array including a plurality of word lines, a plurality of bit lines and a plurality of memory cells;
   a data read/write circuit performing a data read/write operation on selected one or ones of the memory cells, the data read/write circuit further resetting one or ones of the bit lines, which are electrically connected to the selected one or ones of the memory cells, to an initial level in response to a clock signal in a first operation mode and to the initial level irrespective of the clock signal in a second mode; and
   a clock control circuit allowing the clock signal to be generated in the first mode and preventing the clock signal from being generated in the second mode.

14. The device as claimed in claim 13, wherein the device further comprises an internal clock circuit producing an internal clock signal, and the clock control circuit comprises a gate circuit which is opened in the first mode to generate the clock signal and is closed in the second mode to stop generation of the clock signal.

15. The device as claimed in claim 14, wherein the clock control circuit further comprises a latch circuit supplied with a mode designation signal, the latch circuit being brought into a first state by the mode designation signal indicative of the first mode and opening the gate circuit, the latch circuit being brought into a second state by the mode designation signal indicative of the second mode and closing the gate circuit.

16. The device as claimed in claim 15, wherein the device further comprises a plurality of address terminals supplied with address information, and the mode designation signal is produced in response to at least one of the address terminals.

* * * * *